United States Patent
Zheng

(10) Patent No.: US 9,417,289 B2
(45) Date of Patent: Aug. 16, 2016

(54) METHOD AND APPARATUS FOR COLLECTING VOLTAGE DIFFERENTIAL PARAMETERS OF INDIVIDUAL BATTERY CELLS IN BATTERY PACK

(75) Inventor: Weiwei Zheng, Guangdong (CN)

(73) Assignee: SUNWODA ELECTRONICS CO., LTD., Shenzhen (CN)

( * ) Notice: Subject to any disclaimer, the term of this patent is extended or adjusted under 35 U.S.C. 154(b) by 625 days.

(21) Appl. No.: 13/883,853

(22) PCT Filed: Aug. 15, 2011

(86) PCT No.: PCT/CN2011/078424
§ 371 (c)(1),
(2), (4) Date: May 7, 2013

(87) PCT Pub. No.: WO2012/062142
PCT Pub. Date: May 18, 2012

(65) Prior Publication Data
US 2013/0245974 A1 Sep. 19, 2013

(30) Foreign Application Priority Data
Nov. 9, 2010 (CN) .......................... 2010 1 0538921

(51) Int. Cl.
*G06F 19/00* (2011.01)
*G01R 31/36* (2006.01)
*G01R 19/165* (2006.01)

(52) U.S. Cl.
CPC .......... *G01R 31/36* (2013.01); *G01R 19/16542* (2013.01); *G01R 31/362* (2013.01); *G01R 31/3658* (2013.01)

(58) Field of Classification Search
CPC .......... G01V 3/15; C23F 13/04; G01N 17/02
USPC ...................................... 702/63–67, 182–185
See application file for complete search history.

(56) References Cited

U.S. PATENT DOCUMENTS 6,411,098 B1 * 6/2002 Laletin ........................ 324/436

* cited by examiner

*Primary Examiner* — Edward Raymond

(57) ABSTRACT

The invention belongs to the technical field of battery management, and in particular relates to a method and apparatus for collecting voltage differential parameters of individual battery cells in a battery pack. In the invention, a reference voltage is provided, the reference voltage is compared with an actual voltage of each individual battery cell at a same moment to obtain a relative voltage difference value between the actual voltage of each individual battery cell and the common reference voltage at the current moment; and an actual voltage difference value between the actual voltage of each individual battery cell and an actual average voltage value of the actual voltages of all individual battery cells is determined according to the relative voltage difference value, and each actual voltage difference value is used for representing the voltage differential parameter of the individual battery cell relative to a battery system.

8 Claims, 3 Drawing Sheets

METHOD AND APPARATUS FOR COLLECTING VOLTAGE DIFFERENTIAL PARAMETERS OF INDIVIDUAL BATTERY CELLS IN BATTERY PACK

TECHNICAL FIELD OF THE INVENTION

The invention belongs to the technical field of battery management, and in particular relates to a method and apparatus for collecting voltage differential parameters of individual battery cells in a battery pack.

BACKGROUND OF THE INVENTION

In order to meet requirements of large-power equipment such as electric automobiles on voltage, power and energy during operation, a cell pack is generally formed of many batteries connected in series for use. Although the difference between cells decreases gradually with the improvement of technical processes, it is still difficult to guarantee the full consistence of characteristics of all cells in the level of the current manufacture processes. Particularly under operating conditions, irregular charging and discharging are frequently performed, the difference between cells will deteriorate after the cell pack works for a certain period of time, as a result, the utilization efficiency of the cell pack is reduced, and the service life of the cell pack is shortened.

The inconsistence between cells cannot be completely eliminated, particularly such inconsistence existing in the initial stage of manufacture. In order to guarantee the service life of a cell pack, a cell management system emerges as required, the main task of the cell management system is to detect and narrow the difference between cells, that is, the usually called cell equalization technology.

Cell equalization must start in a case that the individual voltage difference is far greater than the measurement error, but the effective equalization time will be too short when the error is great, to avoid this effect, equalization can be started only when cells are to be fully charged or completely emptied, resulting in quite poor equalization effect. Therefore, only equalization performed in a case that the voltage difference of individual battery cells is far greater than the measurement error makes sense, for example, if the measurement error of the individual battery cells is greater than the actual voltage difference between the individual battery cells, the measurement difference rather than the actual difference is equalized, in this case, cell equalization just deteriorates the cell pack instead of prolonging the service life of the cell pack.

Thus, it is crucial to detect the difference between all individual battery cells accurately and timely.

At present, methods for measuring a voltage difference of individual battery cells in a battery pack are almost as follows: measuring an absolute value of voltages at two ends of each individual battery cell, and then calculating the difference between the absolute values via software. For example:

Method 1: A voltage acquisition module is in turn connected to each individual battery cell via a high voltage switching network (often formed of relays), or the voltage of each individual battery cell is in turn transferred to a sampling capacitor, the sampling capacitor is then connected to a voltage measurement module to directly measure the voltage of the individual battery cell, and then the difference between the individual battery cells is calculated via software.

Since there are a large number of individual battery cells connected in series, the voltage of the high voltage resistant individual battery cells is superposed to a very high common-mode voltage, in combination with the voltage drop caused by the constantly changing working current to the internal resistance of the individual battery cells, the terminal voltage of each individual battery cell cannot be accurately measured in the prior art. Meanwhile, as the switching network is high in cost and low in speed, a passive switch is poor in durability, and an active switch is high in electric leakage and poor in reliability, the above method cannot be widely applied in an actual battery system.

Method 2: A battery pack formed of a large number of individual battery cells connected in series is divided into multiple modules, each module only comprising 4 to 16 individual battery cells connected in series. In this way, the total common-mode voltage in each module is limited, a voltage resistant (lower than 60V in general) differential amplifier may be adopted to remove the common-mode voltage to obtain the voltage value of each individual battery cell, the voltage value is then converted into a digital signal via an analog-to-digital converter (ADC) for timeshare inspection, and the digital signal is finally processed by a processor of a cell module.

In a practical environment with electromagnetic interference and also voltage drop caused by a dynamic current to internal resistance, a measurement result obtained by timeshare inspection has many different types of random interferences that cannot be thoroughly eliminated, an insufficiently inaccurate voltage measurement result of the individual battery cell may be obtained according to statistical methods through complex analysis on results of many times of measurement. In this way, the complexity of the system software is greatly improved, thus resulting in increased cost, decreased reliability and increased power consumption of the system, and reducing the technological and economic values of the whole management system. Meanwhile, the differential circuit has restrained actual effect due to element precision and parameter drift, and is not guaranteed to measure the voltage of the individual battery cell accurately for a long period of time.

In conclusion, the existing methods for collecting a difference between the individual battery cells almost employ conventional thoughts as follows: first, collecting absolute voltage values at two ends of each individual battery cell, and then calculating the difference between the individual battery cells based on the absolute voltage values. These methods have not only large error of the collected data but also high cost for collecting the data, and are disadvantageous for the cell management system to perform equalization management to the individual battery cells.

SUMMARY OF THE INVENTION

The first purpose of embodiments of the invention is to provide a method for collecting voltage differential parameters of individual battery cells in a battery pack, by which, the obtained difference representational parameter of the individual battery cell is higher in precision, the cost is lower, and it is more convenient for performing subsequent effective and timely equalization management to the battery pack based on the voltage differential parameter.

The second purpose of the embodiments of the invention is to provide a apparatus for collecting voltage differential parameters of individual battery cells in a battery pack, by which, the obtained difference representational parameter of the individual battery cell is higher in precision, the cost is lower, and it is more convenient for performing subsequent effective and timely equalization management to the battery pack based on the voltage differential parameter.

In order to achieve the first purpose of the invention, the following technical solution is adopted.

A method for collecting voltage differential parameters of individual battery cells in a battery pack is provided, wherein:

a reference voltage is provided, the reference voltage is compared with an actual voltage of each individual battery cell at a same moment to obtain a relative voltage difference value between the actual voltage of each individual battery cell and the reference voltage at the current moment; and an actual voltage difference value between the actual voltage of each individual battery cell and an actual average voltage value of the actual voltages of all individual battery cells is determined according to the relative voltage difference value, and each actual voltage difference value is used for representing the voltage differential parameter of the individual battery cell relative to a battery system.

Optionally, the step of respectively determining each actual voltage difference value according to each relative voltage difference value is as follows:

an arithmetic mean value of the relative voltage difference value between the actual voltages of all individual battery cells and the reference voltage is calculated as a mean relative voltage difference value; and an absolute difference value between the relative voltage difference values and the mean relative voltage difference value is calculated, and each absolute difference value is used as an actual voltage difference value between the actual voltage of each individual battery cell and the mean actual voltage value.

Optionally, the step of determining the actual voltage difference value between the voltage of each individual battery cell and the mean actual voltage value of the voltages of all individual battery cells according to each relative voltage difference value is as follows:

the relative voltage difference value of the voltage of each individual battery cell is added with the reference voltage to obtain the actual voltage value of the voltage of each individual battery cell, respectively;

the arithmetic mean value of the actual voltage values of all individual battery cells is calculated as a mean actual voltage value; and an absolute difference value between the actual voltage value of each individual battery cell and the mean actual voltage value is calculated as an actual voltage difference value between the actual voltage of each individual battery cell and the mean actual voltage value.

Optionally, the reference voltage is a dynamic mean voltage parameter preset according to the charging/discharging status and time of the battery pack.

In order to achieve the second purpose of the invention, the following technical solution is adopted.

A apparatus for collecting voltage differential parameters of individual battery cells in a battery pack is provided, characterized by comprising:

at least one comparison amplification circuit, a reference voltage source electrically connected to each of the comparison amplification circuits, and a main controller;

the reference voltage source is used for providing a reference voltage at the same moment and inputting the reference voltage to a second comparison voltage input end of each comparison amplification circuit;

the number of the comparison amplification circuits is the same as that of the individual battery cells contained in the battery pack, a first comparison voltage input end of each of the comparison amplification circuits is connected to an anode or a cathode of a individual battery cell, respectively, for collecting the voltage of each individual battery cell, the comparison amplification circuits are used for comparing the actual voltages of each individual battery cell input by the first comparison voltage input end and the second comparison voltage input end with the reference voltage to obtain a relative voltage difference value between the actual voltage of each individual battery cell and the reference voltage; and the main controller is electrically connected with each of the comparison amplification circuits and used for determining an actual voltage difference value between the actual voltage of each individual battery cell and the mean actual voltage value of the voltages of all individual battery cells according to each relative voltage difference value.

Optionally, an analog-to-digital (A/D) conversion and communication circuit is further connected in series between each of the comparison amplification circuits and the main controller; and the analog-to-digital (A/D) conversion and communication circuit is electrically connected with the main controller via a serial bus.

Optionally, the main controller comprises a first calculation unit and a second calculation unit electrically connected, the first calculation unit is electrically connected with each of the comparison amplification circuits and used for calculating an arithmetic mean value of a relative voltage difference value between the actual voltages of all individual battery cells and the reference voltage as a mean relative voltage difference value; and the second calculation unit is electrically connected with each of the comparison amplification circuits and the first calculation unit, respectively, and used for calculating an absolute difference value between the relative voltage difference value and the mean relative voltage difference value as an actual voltage difference value between the actual voltage of each individual battery cell and the mean actual voltage value.

Optionally, the main controller comprises a third calculation unit, a fourth calculation unit and a fifth calculation unit electrically connected;

the third calculation unit is electrically connected with an output end of each of the comparison amplification circuits and the reference voltage source, respectively, and used for adding the relative voltage difference value of the voltage of each individual battery cell with the reference voltage to obtain the actual voltage value of each individual battery cell, respectively;

the fourth calculation unit is electrically connected with the third calculation unit, and used for averaging the actual voltage values of all individual battery cells to obtain a mean actual voltage value; and the fifth calculation unit is electrically connected with the third calculation unit and the fourth calculation unit, respectively, and used for calculating an absolute difference value between the actual voltage value of each individual battery cell and the mean actual voltage value as an actual voltage difference value between the actual voltage of each individual battery cell and the mean actual voltage value.

Optionally, the reference voltage is a dynamic mean voltage parameter preset according to the charging/discharging status and time of the battery pack.

As can be seen, in the invention, all individual battery cells are compared with a common reference voltage at the same moment to obtain a relative voltage difference value of an individual battery cell relative to the common reference voltage at the current moment, this relative voltage difference value reflects the individual situation of the individual battery cell at the current moment, the mean actual voltage value of the actual voltages of all individual battery cells reflects the current overall status of the battery system, the actual voltage difference value between the relative voltage difference value and the mean actual voltage value of the actual voltages of all individual battery cells in the current battery system is used as the overall status difference between all individual battery cells and the current battery system, and the quantized voltage parameter is used for representing a voltage differential parameter of each individual battery cell relative to the battery system in the embodiment. When the subsequent voltage equalization management to the batteries is performed, the battery management system may intuitively determine whether the voltage of an individual battery cell is too high or too low according to the quantized voltage differential parameter of each individual battery cell, and regard these individual battery cells with voltage beyond a preset range as individual battery cells to be equalized at present. Therefore, the application of the technical solution of the embodiment is lower in cost, and it is more convenient for performing subsequent effective and timely equalization management to the battery pack based on the voltage differential parameter.

In addition, in this embodiment, when the individual situation of each individual battery cell is acquired, the actual voltage value of each individual battery cell is specifically compared with the common reference voltage at the same moment (synchronously), and the quantized difference value obtained by comparison is used as a quantized parameter for representing the individual situation of the individual battery cell to determine the current status of each individual battery cell. Compared with a technical solution of measuring the voltage status of each individual battery cell by timeshare inspection in the prior art (the status of each individual battery cell obtained in the prior art is actually the status of each individual battery cell at different moments, with low reference value), the quantized parameters of the individual situation obtained by this embodiment are more accurate and comparable, thereby guaranteeing higher precision of the subsequently obtained voltage differential parameters of each individual battery cell, and guaranteeing more accurate, effective and timely subsequent voltage equalization to the battery pack.

In the invention, as each individual battery cell is directly and locally measured to obtain a relative voltage difference value of each individual battery cell, and all individual voltage difference value measurement circuits (one reference voltage source and multiple voltage comparison circuits electrically connected with the reference voltage source) work at the same moment, the influence of the change of the bus pulsating current on the measured result as mentioned in the background art is eliminated. With the technical solution of this embodiment, the influence of the common-mode voltage during timeshare measurement in the prior art can be eliminated.

With the technical solution of this embodiment, the actual voltage of each individual battery cell is synchronously measured at the same moment, respectively, wherein the measurement circuit of each individual battery cell can be spatially very close to an individual battery cell to be measured. Compared with the uniform timeshare detection technical solution in the prior art, the influence of an electromagnetic interference induced current on the measured result can be greatly weakened; furthermore, in the implementation of the invention, the difference value between the voltage of each individual battery cell and a mean value is amplified by comparison amplification circuits only, the precision requirements on circuits, elements and ADCs are greatly decreased, and the defect in the prior art that precision can only be guaranteed by using high-precision analogue circuits and high-digit ADCs is overcome, thus the cost of the embodiment is greatly reduced.

BRIEF DESCRIPTION OF THE DRAWINGS

The accompanying drawings described here are provided for further understanding of the invention and form a part of the application, but not form any improper limitation to the invention, in the accompanying drawings.

IN THE FIGURES

Figure 1:
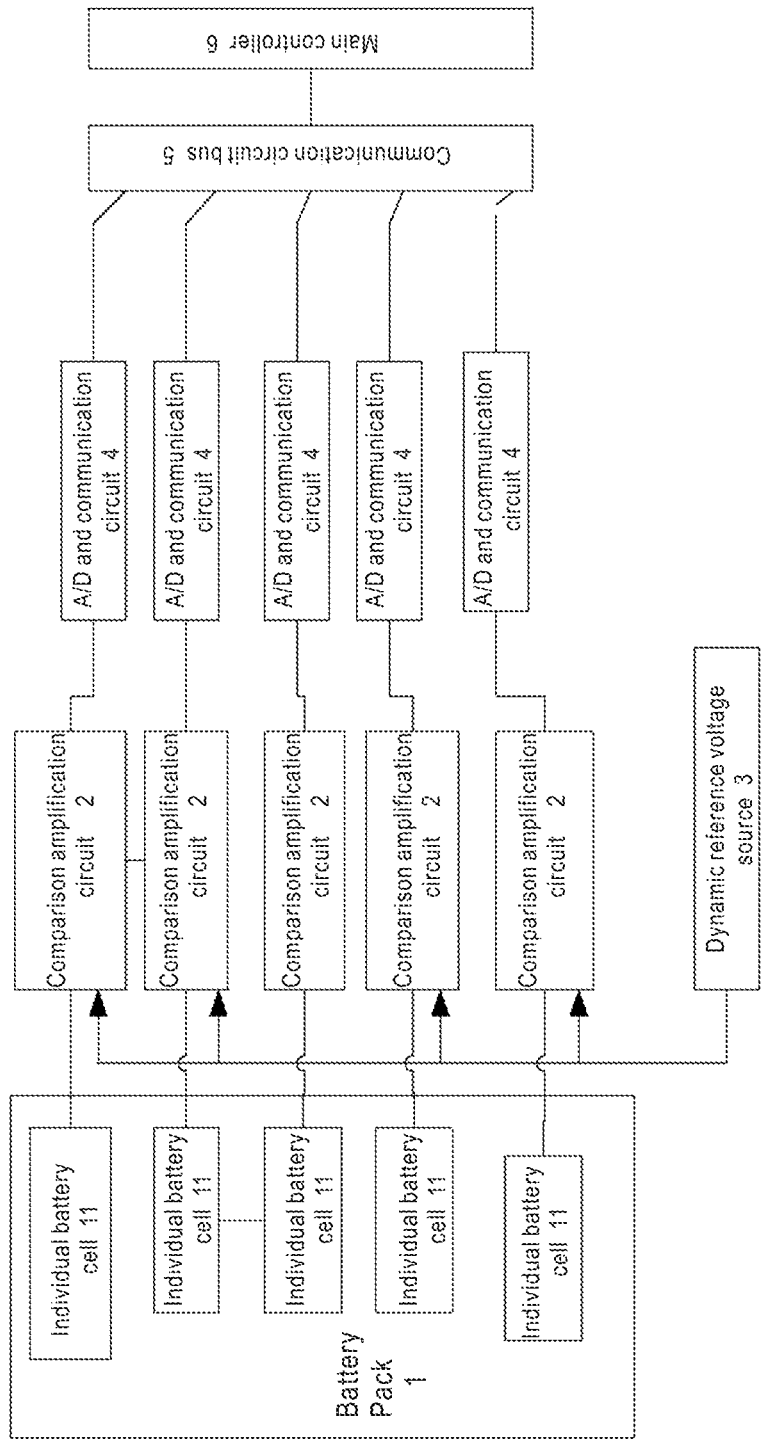
FIG. 1 is a schematic diagram of a device for collecting voltage differential parameters of individual battery cells in a battery pack provided in Embodiment 2 of the invention.

1—Battery pack; 11—Individual battery cell;
2—Comparison amplification circuit; 21—First comparison voltage input end;
22—Second comparison voltage input end; 3—Reference voltage source;
4—A/D and communication circuit; 5—Communication bus;
6—Main controller

DETAILED DESCRIPTION OF THE INVENTION

The invention will be described in detail as below with accompanying drawings and specific embodiments. The exemplary embodiments of the invention and descriptions thereof are provided for explaining the invention, but not for limiting the invention.

Embodiment 1

The embodiment discloses a method for collecting voltage differential parameters of individual battery cells in a battery pack, which is used for measuring and determining a voltage difference of each individual battery cell in a battery system so as to perform subsequent voltage equalization management to the whole battery system according to the voltage difference of the individual battery cell. The method comprises the following main steps:

a reference voltage is provided and respectively compared with the actual voltage value of each individual battery cell at the same moment (i.e. synchronously) to obtain a difference value between the voltage of each individual battery cell at the same current moment and the common reference voltage, and, the difference value is used as a parameter for representing the situation of the individual battery cell at the current moment and recorded as a relative voltage difference value of each individual battery cell in the embodiment; then, an actual voltage difference value between the actual voltage of each individual battery cell at the current moment and a mean value (recorded as a mean actual voltage value) of the actual voltages of all individual battery cells is calculated according to a preset algorithm based on the relative voltage difference value of each individual battery cell, each obtained actual voltage difference value is used for representing the voltage differential parameter of each individual battery cell relative to the overall condition of the battery system, so that the battery system can be equalized rapidly, timely and effectively by using a battery voltage equalization system according to the quantized voltage differential parameter.

Wherein, the reference voltage can be provided by various power sources in the prior art, such as constant current power sources, constant voltage power sources, or even any other power sources with time-varying output voltage or current.

In this embodiment, the following two technical solutions may be adopted, but not limited to, to determine the voltage differential parameter of each individual battery cell relative to the battery system according to each relative voltage difference value:

Algorithm 1: An arithmetic mean value of the relative voltage difference values of all individual battery cells is calculated as a mean relative voltage difference value, then an absolute difference value between the relative voltage difference value (the difference value between the actual voltage value of an individual battery cell and a reference voltage) of each individual battery cell and the current mean relative voltage difference value obtained by calculation is calculated and used for representing the voltage differential parameter of each individual battery cell relative to the battery system at the current moment.

Algorithm 2: Step 1, the relative voltage difference value of the voltage of each individual battery cell is added with the reference voltage to obtain an actual voltage value of the voltage of each individual battery cell, respectively; step 2, an arithmetic mean value of the actual voltage values of all individual battery cells is calculated as a mean actual voltage value; step 3, an absolute difference value between the actual voltage value of each individual battery cell obtained in Step 1 and the mean actual voltage value obtained in Step 2 is calculated as a voltage differential parameter for representing each individual battery cell relative to the battery system at the current moment, being an actual voltage difference value between the voltage of each individual battery cell and the mean actual voltage value.

For example: an individual battery cell pack consists of fiver individual battery cells, at a certain moment, the reference voltage provided by the reference voltage source is 2.5V, the actual voltage of each individual battery cell is: V1=2.90V, V2=2.98V, V3=3.01V, V4=3.02V, and V5=3.03V, respectively, then the relative voltage difference values collected according to the method of this embodiment are 0.40V, 0.48V, 0.51V, 0.52V and 0.53V, respectively.

According to Algorithm 1:

the mean relative voltage difference value is: (0.40V+0.48V+0.51V+0.52 V+0.53V)/5=0.488 V.

The final actual voltage difference value of each individual battery cell is:

|0.40V−0.488V|=0.088V, |0.48V−0.488V|=0.008V,

|0.51V−0.488V|=0.022V, |0.52V−0.488V|=0.032V,

|0.53V−0.488V|=0.042V.

As can be seen, an individual battery cell with the maximum difference is the individual battery cell having a difference value of 0.088V, so the cell management system may take accurate equalization measures according to the above results during the subsequent voltage equalization.

According to Algorithm 2:

the collected actual voltage value of the voltage of each individual battery cell is:

V1=0.40 V+2.5V=2.90V, V2=0.48 V+2.5V=2.98V,

V3=0.51 V+2.5V=3.01V, V4=0.52 V+2.5V=3.02V,

V5=0.53V+2.5V=3.03V;

the mean actual voltage value is 2.988V; and, the final actual voltage different value of each individual battery cell is:

|2.90V−2.988V|=0.088V, |2.98V−2.988V|=0.088V,

|3.01V−2.988V|=0.022V, |3.02V−2.988V|=0.032V,

|3.03V 2.988V|=0.042V.

As can be seen, an individual battery cell with the maximum difference is the individual battery cell having a difference value of 0.088V, so the cell management system may take accurate equalization measures according to the above results.

Of course, the closer the reference voltage set during the actual collection approaches to the mean value of the actual voltages, the higher the measurement precision is. Therefore, the reference voltage should better be a dynamic mean voltage parameter set according to the charging/discharging status and time of the battery pack, that is, the reference voltage is approximately equal to the total mean value of the voltages of all serial individual battery cells. The charging/discharging status comprises a charging status, a discharging status and a charging/discharging silent period (an intermediate status of silence between the charging status and the discharging status). The reference voltage can be obtained by directly dividing the total voltage of the cell pack according to the number of the individual battery cells connected in series.

It should be noted that, the invention is not limited to the above two algorithms, and any other algorithms may also be possible as long as the cell with large difference in the battery pack can be found according to the algorithm. Or even, other values, such as a square root of the voltage difference value of the individual battery cell, reflecting the difference between the individual battery cells, rather than the voltage difference value of the individual battery cells of the battery pack, are collected as long as with the measurement method 'a reference voltage is provided and compared with the voltage of each individual battery cell at the same moment to obtain a relative voltage difference value between the voltage of each individual battery cell and the reference voltage at the current moment', all of which fall into the protection scope of the invention.

It should be noted that, in this embodiment, as the voltage of each individual battery cell is compared with a unique reference voltage at the same moment (i.e., synchronously), the status of each individual battery cell at the same moment is determined; and as the common reference voltage is unique, the voltage of the common reference voltage at the same moment is uniquely determined, that is, the change (such as fluctuation or interference) of the reference voltage does not affect the measured result. Therefore, the dynamic voltage source in this embodiment may be a dynamic voltage source, that is, the provided voltage may change with time, so the equipment cost may be effectively reduced while guaranteeing the measurement stability and accuracy.

Embodiment 2

This embodiment discloses a apparatus for collecting voltage differential parameters of individual battery cells in a battery pack, corresponding to Embodiment 1.

As shown in FIG. 1, the apparatus comprises comparison amplification circuits 2, a reference voltage source 3, A/D and communication circuits 4, a communication bus 5 and a main controller 6.

Wherein, the number of the comparison amplification circuits 2 and the A/D and communication circuits 4 is the same as that of the individual battery cells 11 included in the battery pack 1, and in FIG. 1, only a case of six individual battery cells is exemplarily shown. A first comparison voltage input end 21 of each comparison amplification circuit 2 is connected with anode or cathode of one individual battery cell 11 to collect the voltage of each individual battery cell; the reference voltage source 3 provides a reference voltages to second comparison voltage input ends 22 of all comparison amplification circuits 2 at the same moment; the comparison amplification circuit 2 compares the reference voltage at the current moment with the actual voltage of the individual battery cell corresponding to this comparison amplification circuit to obtain a relative voltage difference value between the reference voltage and the voltage of each individual battery cell; the main controller 6 according to a preset algorithm calculates an actual voltage difference value (for representing a voltage differential parameter of the individual battery cell relative to the battery system at the current moment) between the voltage of each individual battery cell and a mean actual voltage value of the voltages of all individual battery cells according to the obtained relative voltage difference value; one A/D and communication circuit 4 may be further connected in series between each comparison amplification circuit 2 and the main controller 6 of the cell management system; and the A/D and communication circuits 4 are connected with the main controller 6 via the serial bus 5.

As shown in FIG. 1, when the apparatus works:

1. the reference voltage source 3 provides a reference voltage to the second comparison voltage input ends 22 of all comparison amplification circuits 2 at the same moment, the reference voltage source being a constant current power source, constant voltage power source, or any other power source with time-varying output voltage or current;

2. meanwhile, the first comparison voltage input end 21 of each comparison amplification circuit 2 collects the actual voltage of each individual battery cell 11, and compares the parameters input by the first comparison voltage input end 21 and the second comparison voltage input end 21 to obtain a relative voltage difference value between the actual voltage of each individual battery cell and the current common reference voltage;

3. the A/D and communication circuits 4 transmits the relative difference value to the main controller 6 via the communication bus after performing analog-to-digital conversion on the above relative difference value, to be calculated according to a preset algorithm and then applied.

Figure 2:
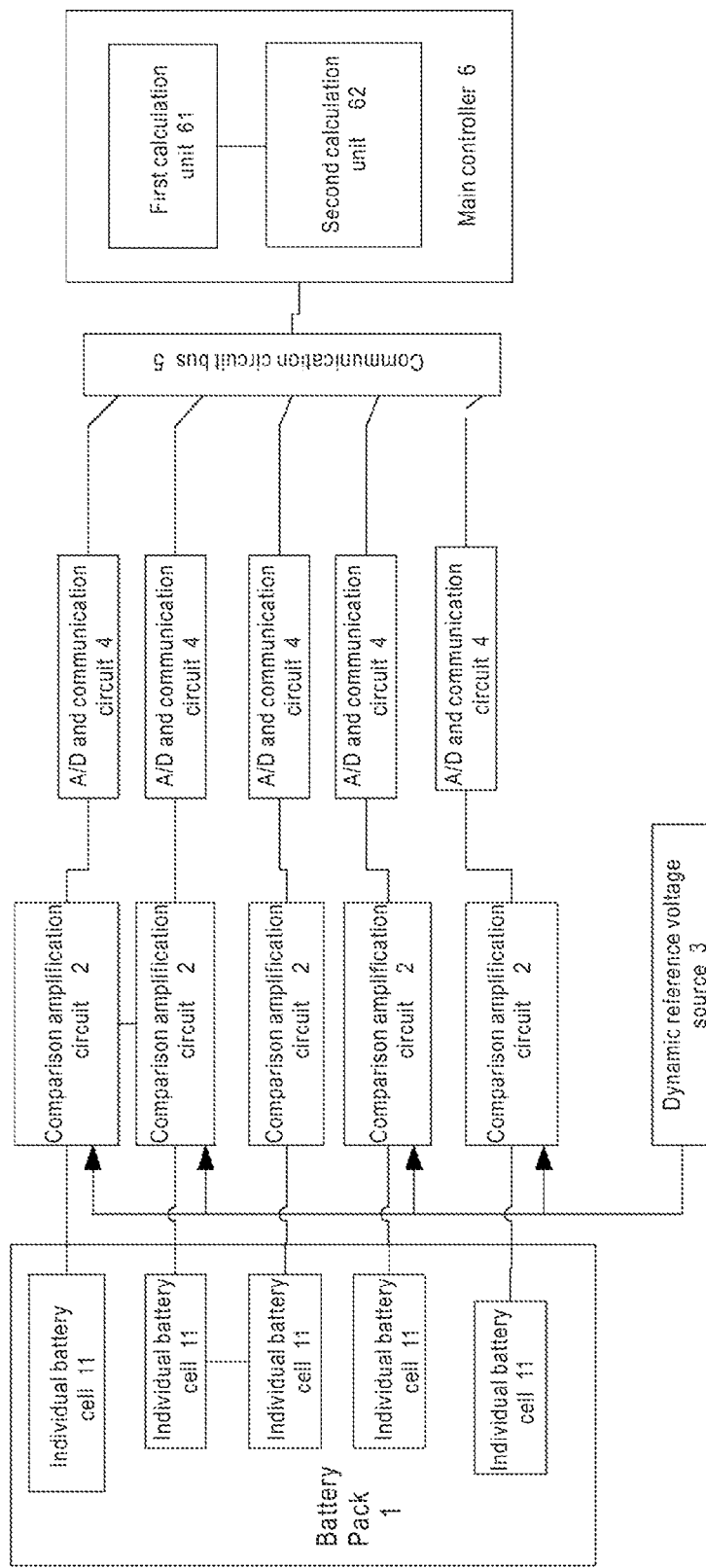
FIG. 2 is a schematic diagram of the implementation mode 1 thereof.
Figure 3:
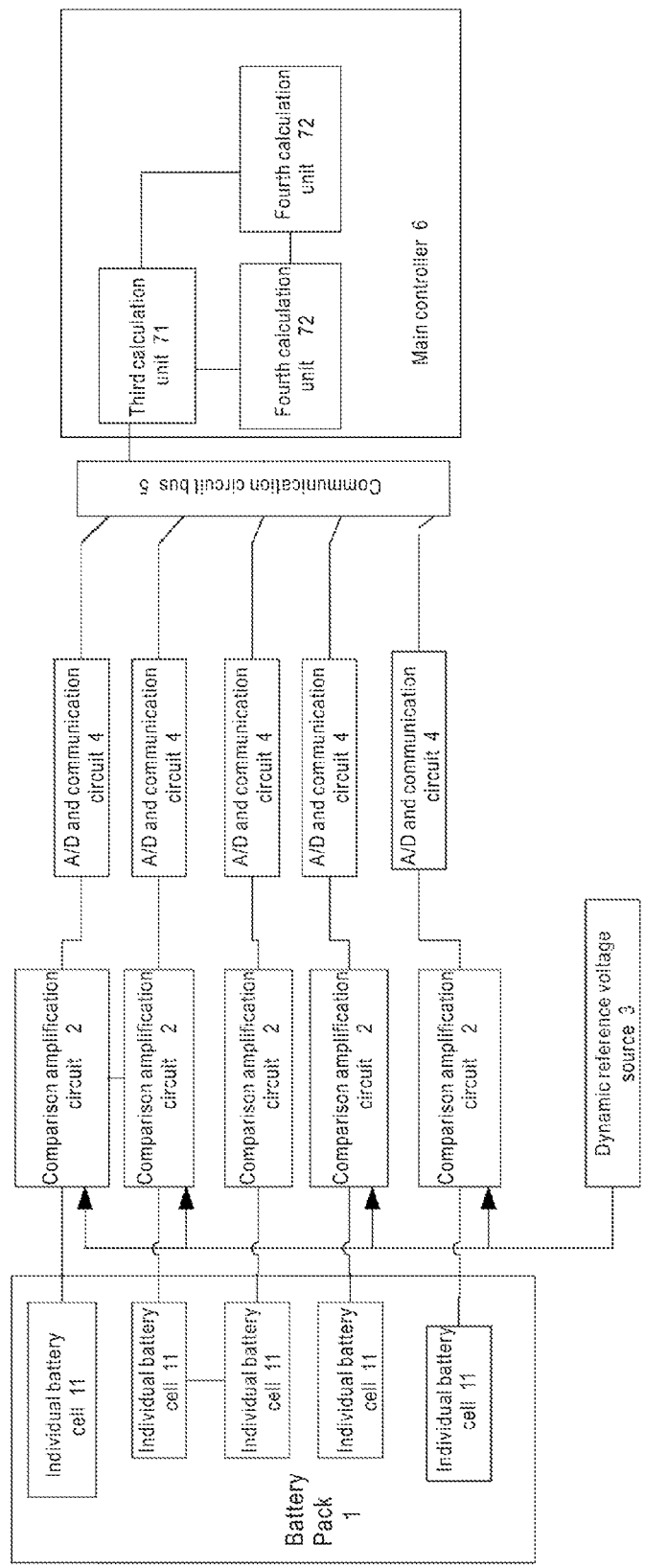
FIG. 3 is a schematic diagram of the implementation mode 2 thereof.

The technical solution and principle of determining the voltage differential parameter for representing each individual battery cell relative to the battery system according to each relative voltage difference value in this embodiment are the same as those in Embodiment 1, and the implementation structures respectively shown in FIG. 2 and FIG. 3 may be adopted (but not limit to) during the practical application.

Optional implementation mode 1: as shown in FIG. 2, the main controller 6 further comprises a first calculation unit 61 and a second calculation unit 62 electrically connected.

Wherein, the first calculation unit 61 is electrically connected with each comparison amplification circuit 2 and the reference voltage source 3, respectively (via, but not limited to, the communication bus 5 and the A/D and communication circuits 4), and used for calculating an arithmetic mean value between the actual voltage of each individual battery cell and the relative voltage difference value of the common reference voltage as a mean relative voltage difference value;

the second calculation unit 62 is electrically connected with each comparison amplification circuit 2 and the first calculation unit 61, respectively (via, but not limited to, the communication bus 5 and the A/D and communication circuits 4), and used for calculating an absolute difference value between each relative voltage difference value obtained by each comparison amplification circuit 2 and a mean relative voltage different value obtained by the first calculation unit 61 as an actual voltage difference value between the actual voltage of each individual battery cell and the mean actual voltage value, the actual voltage difference value representing the voltage differential parameter of each individual battery cell relative to the battery system.

Implementation mode 2:

As shown in FIG. 3, the main controller 6 further comprises a third calculation unit 71, a fourth calculation unit 72 and a fifth calculation unit 73 electrically connected;

the third calculation unit 71 is electrically connected with the output end of each comparison amplification circuit 2 and the reference voltage source 3, respectively (via, but not limited to, the communication bus 5 and the A/D and communication circuits 4), and used for adding the relative voltage difference value of the voltage of each individual battery cell with the common reference voltage, and using each obtained sum as the actual voltage value of each individual battery cell, respectively;

the fourth calculation unit 72 is electrically connected with the third calculation unit 71 and used for calculating an arithmetic mean value of the actual voltage values of all individual battery cells to obtain a mean actual voltage value;

the fifth calculation unit 73 is electrically connected with the third calculation unit 71 and the fourth calculation unit 72, respectively, and used for calculating an absolute difference value between the actual voltage value of each individual battery cell obtained by the third calculation unit 71 and the mean actual voltage value obtained by the fourth calculation unit 72 as an actual voltage difference value between the actual voltage of each individual battery cell and the mean actual voltage value, the actual voltage difference value representing the voltage differential parameter of each individual battery cell relative to the battery system at the current moment.

Although the technical solutions provided by the embodiments of the invention have been introduced in detail as above, and the principle and implementation modes of the invention have been elaborated by specific examples, the explanations of the above embodiments only apply to assisting in understanding the principle of the embodiments of the invention. Meanwhile, for a person skilled in the field, in accordance with the embodiments of the invention, both the specific implementation modes and the application scope may have various changes. In conclusion, the contents of the specification should not be understood as limitations to the invention.

What is claimed is:

1. A method for collecting voltage differential parameters of individual battery cells in a battery pack, wherein, a reference voltage is provided, the reference voltage is compared with an actual voltage of each individual battery cell at a same moment to obtain a relative voltage difference value between the actual voltage of each individual battery cell and the reference voltage at the current moment; and an actual voltage difference value between the actual voltage of each individual battery cell and an actual average voltage value of the actual voltages of all individual battery cells is determined according to the relative voltage difference value, and each actual voltage difference value is used for representing the voltage differential parameter of the individual battery cell relative to a battery system, wherein, the actual voltage difference value between the voltage of each individual battery cell and the mean actual voltage value of the voltages of all individual battery cells is determined according to each relative voltage difference value, specifically:

the relative voltage difference value of the voltage of each individual battery cell is added with the reference voltage to obtain the actual voltage value of the voltage of each individual battery cell, respectively;

the arithmetic mean value of the actual voltage values of all individual battery cells is calculated as a mean actual voltage value; and an absolute difference value between the actual voltage value of each individual battery cell and the mean actual voltage value is calculated as an actual voltage difference value between the actual voltage of each individual battery cell and the mean actual voltage value.

2. The method for collecting voltage differential parameters of individual battery cells in a battery pack according to claim 1, wherein, the reference voltage is a voltage parameter changing with time, preset according to the charging/discharging status and time of the battery pack.

3. A apparatus for collecting voltage differential parameters of individual battery cells in a battery pack, comprising:

at least one comparison amplification circuit, a reference voltage source electrically connected to each of the comparison amplification circuits, and a main controller;

the reference voltage source is used for providing a reference voltage at the same moment and inputting the reference voltage to a second comparison voltage input end of each comparison amplification circuit;

the number of the comparison amplification circuits is the same as that of the individual battery cells contained in the battery pack, a first comparison voltage input end of each of the comparison amplification circuits is connected to an anode or a cathode of a individual battery cell, respectively, for collecting the voltage of each individual battery cell, the comparison amplification circuits are used for comparing the actual voltages of each individual battery cell input by the first comparison voltage input end and the second comparison voltage input end with the reference voltage to obtain a relative voltage difference value between the actual voltage of each individual battery cell and the reference voltage; and the main controller is electrically connected with each of the comparison amplification circuits and used for determining an actual voltage difference value between the actual voltage of each individual battery cell and the mean actual voltage value of the voltages of all individual battery cells according to each relative voltage difference value.

4. The apparatus for collecting voltage differential parameters of individual battery cells in a battery pack according to claim 3, wherein, an analog-to-digital (A/D) conversion and communication circuit is further connected in series between each of the comparison amplification circuits and the main controller; and the analog-to-digital (A/D) conversion and communication circuit is electrically connected with the main controller via a serial bus.

5. The apparatus for collecting voltage differential parameters of individual battery cells in a battery pack according to claim 4, wherein, the main controller comprises a first calculation unit and a second calculation unit electrically connected, the first calculation unit is electrically connected with each of the comparison amplification circuits and used for calculating an arithmetic mean value of a relative voltage difference value between the actual voltages of all individual battery cells and the reference voltage as a mean relative voltage difference value; and the second calculation unit is electrically connected with each of the comparison amplification circuits and the first calculation unit, respectively, and used for calculating an absolute difference value between the relative voltage difference value and the mean relative voltage difference value as an actual voltage difference value between the actual voltage of each individual battery cell and the mean actual voltage value.

6. The apparatus for collecting voltage differential parameters of individual battery cells in a battery pack according to claim 4, wherein, the main controller comprises a third calculation unit, a fourth calculation unit and a fifth calculation unit electrically connected;

the third calculation unit is electrically connected with an output end of each of the comparison amplification circuits and the reference voltage source, respectively, and used for adding the relative voltage difference value of the voltage of each individual battery cell with the reference voltage to obtain the actual voltage value of each individual battery cell, respectively;

the fourth calculation unit is electrically connected with the third calculation unit, and used for averaging the actual voltage values of all individual battery cells to obtain a mean actual voltage value; and the fifth calculation unit is electrically connected with the third calculation unit and the fourth calculation unit, respectively, and used for calculating an absolute difference value between the actual voltage value of each individual battery cell and the mean actual voltage value as an actual voltage difference value between the actual voltage of each individual battery cell and the mean actual voltage value.

7. The apparatus for collecting voltage differential parameters of individual battery cells in a battery pack according to claim 6, wherein, the reference voltage is a voltage parameter changing with time, preset according to the charging/discharging status and time of the battery pack.

8. A method for collecting voltage differential parameters of individual battery cells in a battery pack, wherein, a reference voltage is provided, the reference voltage is compared with an actual voltage of each individual battery cell at a same moment to obtain a relative voltage difference value between the actual voltage of each individual battery cell and the reference voltage at the current moment; and an actual voltage difference value between the actual voltage of each individual battery cell and an actual average voltage value of the actual voltages of all individual battery cells is determined according to the relative voltage difference value, and each actual voltage difference value is used for representing the voltage differential parameter of the individual battery cell relative to a battery system, wherein, each actual voltage difference value is respectively determined according to each relative voltage difference value, specifically:

an arithmetic mean value of the relative voltage difference value between the actual voltages of all individual battery cells and the reference voltage is calculated as a mean relative voltage difference value; and an absolute difference value between the relative voltage difference values and the mean relative voltage difference value is calculated, and each absolute difference value is used as an actual voltage difference value between the actual voltage of each individual battery cell and the mean actual voltage value.

\* \* \* \* \*